(12) United States Patent
Nair et al.

(10) Patent No.: US 6,411,151 B1
(45) Date of Patent: Jun. 25, 2002

(54) LOW JITTER EXTERNAL CLOCKING

(75) Inventors: Rajendran Nair, Hillsboro; Gregory E. Dermer, Portland; Stephen R. Mooney; Nitin Y. Borkar, both of Beaverton, all of OR (US)

(73) Assignee: Inter Corporation, Santa Clara, CA (US)

( * ) Notice: Subject to any disclaimer, the term of this patent is extended or adjusted under 35 U.S.C. 154(b) by 0 days.

(21) Appl. No.: 09/459,783

(22) Filed: Dec. 13, 1999

(51) Int. Cl.[7] ............................... G06F 1/04; H03K 3/00
(52) U.S. Cl. ..................... 327/291; 327/563; 330/253
(58) Field of Search ..................... 327/65, 291, 298, 327/165, 262, 563; 330/252, 253

(56) References Cited

U.S. PATENT DOCUMENTS

| | | | | |
|---|---|---|---|---|
| 5,530,401 A | * | 6/1996 | Cao et al. ..................... | 327/563 |
| 5,546,023 A | * | 8/1996 | Borkar et al. ................. | 326/93 |
| 5,672,991 A | * | 9/1997 | Thoma et al. ................ | 327/239 |
| 5,821,809 A | * | 10/1998 | Boerstler et al. ............ | 327/563 |
| 5,942,940 A | * | 8/1999 | Dreps et al. ................. | 330/253 |
| 6,028,454 A | * | 2/2000 | Elmasry et al. ............. | 326/115 |
| 6,087,885 A | * | 7/2000 | Tobita ......................... | 327/379 |
| 6,141,265 A | * | 10/2000 | Jeon ............................ | 365/194 |
| 6,198,688 B1 | * | 3/2001 | Choi ........................... | 365/233 |

* cited by examiner

*Primary Examiner*—Toan Tran
*Assistant Examiner*—Quan Tra
(74) *Attorney, Agent, or Firm*—Schwegman, Lundberg, Woessner & Kluth, P.A.

(57) ABSTRACT

A low jitter external clocking system and method are disclosed. According to one embodiment of the present invention, a differential clock signal is received on a first clock signal line and a second clock signal line. A differential amplifier coupled to the first clock signal line and the second clock signal line amplifies the differential clock signal into a single-ended output clock signal.

34 Claims, 4 Drawing Sheets

LOW JITTER EXTERNAL CLOCKING

FIELD OF THE INVENTION

The invention relates generally to integrated circuits, and more particularly to low jitter external clocking.

BACKGROUND

Digital integrated circuit systems often include one or more processors, memory devices, and input/output devices that communicate with each other through a bus system. Each device includes an integrated circuit made up of an arrangement of logic gates, and each gate implements a logic function. The gates are interconnected and communicate with each other by changing state in unison at regular, timed intervals according to an internal clock signal. Information input to the integrated circuit, in the form of signals, is acted upon by the logic gates which produce new information as output signals.

Digital integrated circuits are typically timed by a clock generator that functions through a phase-locked loop. The phase-locked loop locks an internal clock signal in phase and frequency to an external input clock. The phase-locked loop has the capability to create additional clock signals with frequencies that are multiples of the frequency of the external input clock, while maintaining a phase relationship with the external input clock. In addition, the phase-locked loop rejects external input clock jitter. However, the phase-locked loop has a lock time requirement that delays a start-up of an integrated circuit from an idle/power-down state, and is a sophisticated analog circuit that does not scale easily with process changes.

In a very high frequency synchronous integrated circuit system, operating at gigahertz frequencies and higher, the phase-locked loop is used to multiply a frequency of an external input clock to generate a very high frequency internal clock signal in an integrated circuit in the system. In generating such high frequencies the phase-locked loop can contribute to jitter in the internal clock signal, and also suffers from problems of instability and noise. There remains a need for very high frequency synchronous integrated circuit systems that are timed in a manner to minimize jitter, instability, and noise in an internal clock signal.

SUMMARY OF THE INVENTION

According to one embodiment of the present invention, a differential clock signal is received on a first clock signal line and a second clock signal line. A differential amplifier coupled to the first clock signal line and the second clock signal line amplifies the differential clock signal into a single-ended output clock signal.

Advantages of the invention will be apparent to one skilled in the art upon an examination of the detailed description.

DETAILED DESCRIPTION

In the following detailed description of exemplary embodiments of the present invention, reference is made to the accompanying drawings which form a part hereof, and in which are shown by way of illustration specific exemplary embodiments in which the present invention may be practiced. These embodiments are described in sufficient detail to enable those skilled in the art to practice the present invention, and it is to be understood that other embodiments may be utilized and that logical, mechanical, electrical and other changes may be made without departing from the spirit or scope of the present invention. The following detailed description is, therefore, not to be taken in a limiting sense, and the scope of the present invention is defined only by the claims.

In this description transistors may be described as being in an active state or switched on when they are rendered conductive by an appropriate control signal, and the transistors may be described as being in an inactive state or switched off when they are rendered non-conductive by the control signal. A digital signal of 1 may also be called a high signal and a digital signal of 0 may also be called a low signal. A clock signal is an approximately square wave voltage signal that is either at a high voltage (high) or at a low voltage (low), or in transition between the two voltages.

Figure 1A:
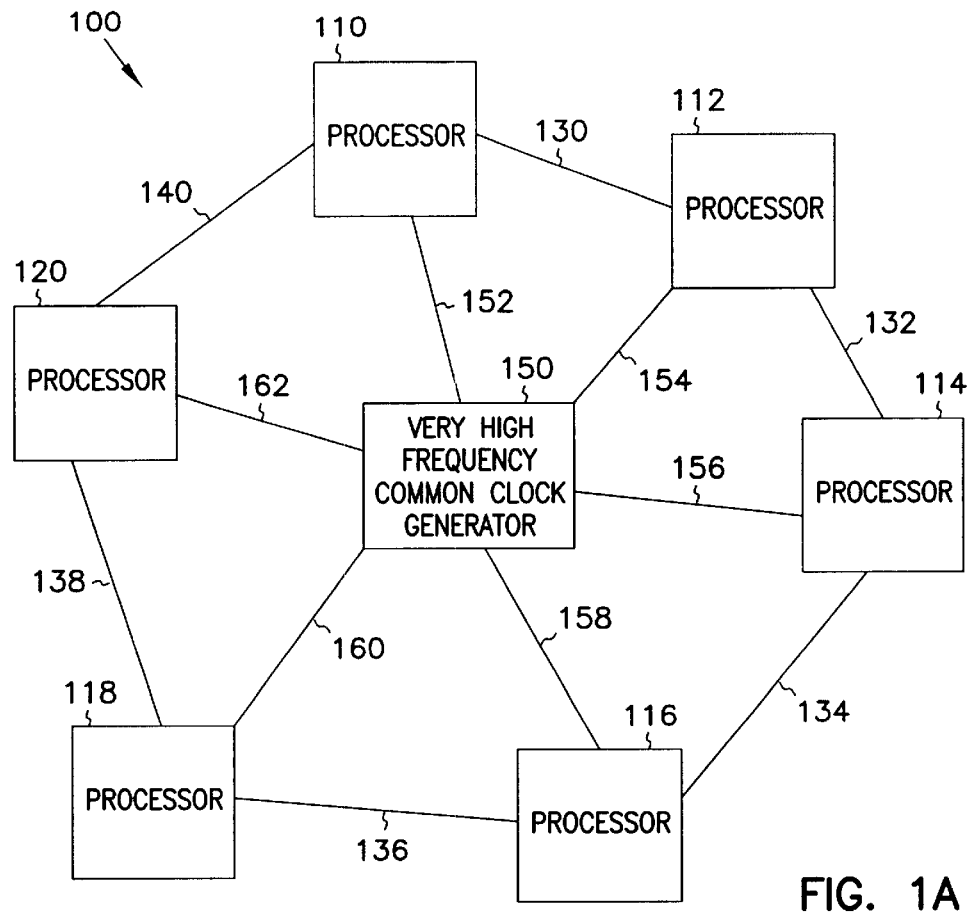
FIG. 1A is a block diagram of a very high frequency synchronous integrated circuit system according to an embodiment of the present invention.

A block diagram of a very high frequency synchronous integrated circuit system 100 is shown in FIG. 1A according to an embodiment of the present invention. The system 100 is a multiple-chip system which may be a multiple-processor system, or a multiple-device system where each device includes a processor such as a microprocessor, a digital signal processor, a microcontroller, an ASIC, or another type of circuit that communicates with the system 100. The system 100 may be, for example, a multi-processing system with a number of microprocessors, such as a 2-way, a 4-way, an 8-way, or a 16-way computer system. The system 100 may also be a routing switch with multiple cross-bar components that are interconnected to route incoming data to an appropriate output. The system 100 is shown for illustrative purposes only, and embodiments of the present invention may be employed in any system timed with a clock signal. The system 100 includes a number of processors 110–120, and each processor 110–120 is coupled to a neighboring processor by a respective communication link 130–140. The communication links 130–140 will be more fully described hereinbelow. The system 100 also includes a very high frequency common clock generator 150 that generates a gigahertz frequency clock signal. The clock signal is coupled to each of the processors 110–120 through respective clock signal lines 152–162. The existence of the clock generator 150 providing a very high frequency clock signal eliminates any need for phase-locked loops in the processors 110–120 to multiply a frequency of an external input clock. As mentioned above, alternative embodiments of the present invention may include any type of circuit that communicates with the system 100 other than the processors 110–120. The circuits or the processors 110–120 may be located in parts of a single semiconductor die, or in several separate dies.

The system 100 is a source-synchronous system meaning that any communication of data between two of the processors 110–120 over one of the communication links 130–140 is accompanied by a clock signal. The system 100 is not a common clock system and communication between the processors 110–120 is not timed by the clock signal from the clock generator 150. Rather, each processor 110–120 synchronizes a clock signal with a data signal and transmits the clock signal and the data signal together over one of the communication links 130–140. This is necessary because in very high frequency multiple-chip systems operating at gigahertz frequencies the period of the clock signal is approximately one nanosecond. A very high frequency clock signal generated from a common clock will not reach each chip at the same time due to differences in length, impedance discontinuities, and other physical characteristics of the various clock signal lines 152–162. The very high frequency clock signal is useful to the processors 110–120 for its frequency, but the edges of the very high frequency clock signal cannot be relied upon for timing.

For example, in the system 100 shown in FIG. 1A each of the clock signal lines 152–162 has a different length because each of the processors 110–120 is located a different distance from the clock generator 150. The gigahertz frequency clock signal will arrive early at some of the processors 110–120 and late at others because the nanosecond period of the clock signal is too short to accommodate for the differences between the clock signal lines 152–162. Each communication of data between the processors 110–120 must therefore be synchronized to its own clock signal to ensure that the data is properly received. Valid data transmission occurs even though the lengths of the individual communication links 130–140 are different because data signals and clock signals are traveling over the same distance. Any difference in the arrival time of synchronized clock signals and data signals is short enough, even in a gigahertz frequency system, to support valid data transmission. All of the synchronized clock signals transmitted with data signals in the system 100 are derived from the very high frequency clock signal produced by the clock generator 150.

Figure 1B:
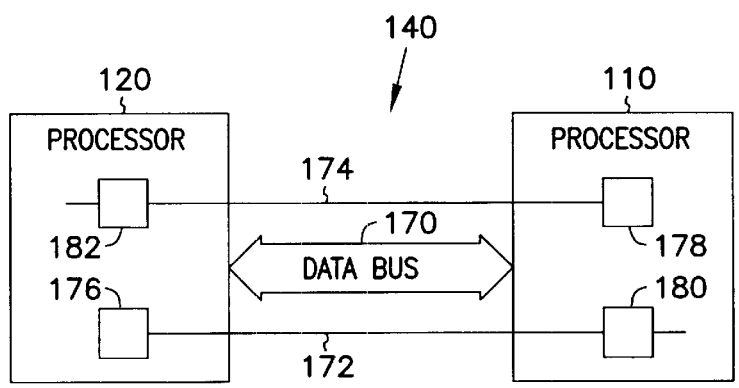
FIG. 1B is an electrical schematic diagram of communication link in the system of FIG. 1A according to an embodiment of the present invention.

One of the communication links 140 between the processors 110 and 120 shown in FIG. 1A is shown in FIG. 1B according to an embodiment of the present invention. All of the communication links 130–140 are the same or similar to each other, and the communication link 140 is shown in FIG. 1B in more detail as an example. The communication link 140 includes a data bus 170 and two clock signal lines 172, 174. The data bus 170 includes multiple data lines and is similar to data buses known to those skilled in the art. Data signals may be transmitted in two directions over the data bus 170, from the processor 110 to the processor 120, or in the opposite direction. The two clock signal lines 172, 174 are differential clock signal lines, each comprising two lines and carrying differential clock signals in opposite directions. When the processor 120 transmits data signals to the processor 110 over the data bus 170 the processor 120 also generates a differential clock signal in a differential clock signal generating circuit 176 that is synchronized with the data signals and transmitted over the differential clock signal line 172 to the processor 110. The processor 110 receives the differential clock signal in a differential clock signal receiver circuit 180. Likewise, the processor 110 may generate and transmit a differential clock signal from a differential clock signal generating circuit 178 over the differential clock signal line 174 to the processor 120 along with data signals on the data bus 170. The processor 120 receives the differential clock signal in a differential clock signal receiver circuit 182. The differential clock signal receiver circuits 180, 182 each generate a single-ended output clock signal from the differential clock signal for use by the respective processors 110, 120, to process the data signals received from the data bus 170 as will be described hereinbelow.

Noise may be induced in the differential clock signal lines 172, 174 by chips or circuits close to the communication link 140, by power supplies for the respective processors 110, 120, or by other sources of noise known to those skilled in the art. The noise in the differential clock signal lines 172, 174 is common-mode noise that may be substantially rejected by the differential clock signal receiver circuits 180, 182 as will be described hereinbelow.

Figure 2:
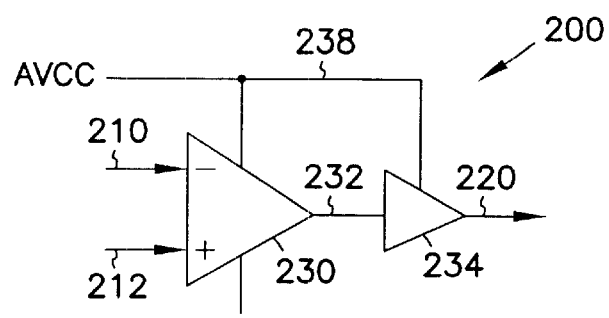
FIG. 2 is an electrical schematic diagram of a differential clock signal receiver circuit according to an embodiment of the present invention.

An electrical schematic diagram of a differential clock signal receiver circuit 200 is shown in FIG. 2 according to an embodiment of the present invention. Each of the differential clock signal receiver circuits 180, 182 may be implemented according to the receiver circuit 200 of this embodiment of the present invention. The receiver circuit 200 is coupled to receive a very high frequency differential clock signal from a pair of clock signal lines 210, 212, and generates a single-ended output clock signal on a line 220. The lines 210, 212 may comprise one of the differential clock signal lines 172, 174 shown in FIG. 1B. The differential clock signal arrives as two signals that are 180 degrees out of phase with each other on the lines 210, 212. In other words, the clock signal on the line 210 is high when the clock signal on the line 212 is low, and visa-versa. The receiver circuit 200 includes a differential amplifier 230 having an inverting input connected to the line 210 and a non-inverting input connected to the line 212 to receive the differential clock signal. The differential amplifier 230 generates a single-ended clock signal on a line 232 that is connected to an input of a voltage follower 234. The voltage follower 234 buffers the differential amplifier 230 and generates the single-ended output clock signal on the line 220. The differential amplifier 230 and the voltage follower 234 are coupled to receive an analog supply voltage AVCC on a line 238. The differential amplifier 230 substantially rejects common-mode noise in the differential clock signal.

Figure 3:
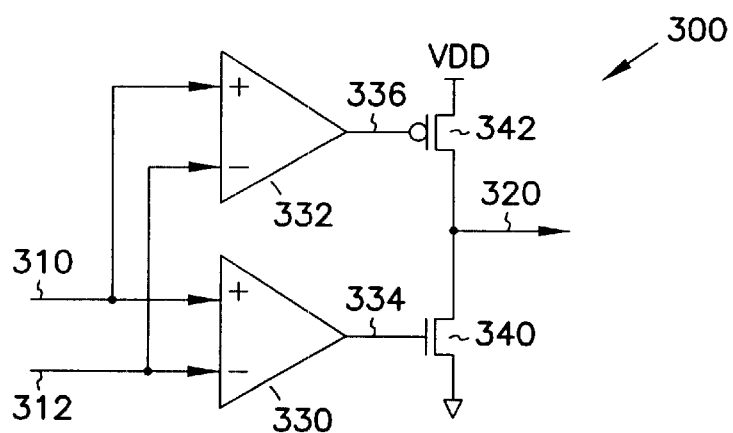
FIG. 3 is an electrical schematic diagram of a differential clock signal receiver circuit according to an embodiment of the present invention.

An electrical schematic diagram of a differential clock signal receiver circuit 300 is shown in FIG. 3 according to an embodiment of the present invention. Each of the differential clock signal receiver circuits 180, 182 may be implemented according to the receiver circuit 300 of this embodiment of the present invention. The receiver circuit 300 is coupled to receive a very high frequency differential clock signal from a pair of clock signal lines 310, 312, and generates a single-ended output clock signal on a line 320. The lines 310, 312 may comprise one of the differential clock signal lines 172, 174 shown in FIG. 1B. The differential clock signal arrives as two signals that are 180 degrees out of phase with each other on the lines 310, 312. The receiver circuit 300 includes first and second differential amplifiers 330, 332, both of which have a non-inverting input connected to the line 310 and an inverting input connected to the line 312. The differential amplifiers 330, 332 generate single-ended clock signals on respective lines 334, 336. The line 334 is connected to a gate of an n-channel transistor 340 having a drain connected to the line 320 and a source coupled to a ground voltage reference. The line 336 is connected to a gate of a p-channel transistor 342 having a source coupled to a voltage supply VDD and a drain connected to the line 320. The two single-ended clock signals on the lines 334, 336 are in phase with each other, or, in other words, are high or low at the same time, because of the similar input connections of the differential amplifiers 330, 332. As a result, either the p-channel transistor 342 is on, or the n-channel transistor 340 is on, and the other transistor 340, 342 is off to generate the single-ended output clock signal on the line 320. The p-channel transistor 342 and the n-channel transistor 340 are fabricated as complementary devices in a CMOS process. The differential amplifiers 330, 332 substantially reject common-mode noise in the differential clock signal.

Figure 4:
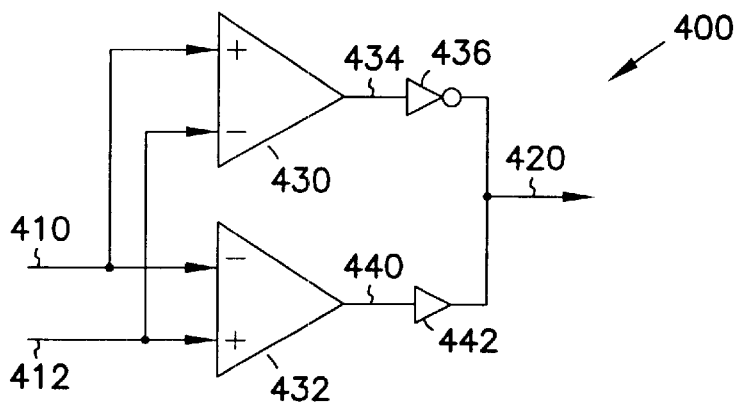
FIG. 4 is an electrical schematic diagram of a differential clock signal receiver circuit according to an embodiment of the present invention.

An electrical schematic diagram of a differential clock signal receiver circuit 400 is shown in FIG. 4 according to an embodiment of the present invention. Each of the differential clock signal receiver circuits 180, 182 may be implemented according to the receiver circuit 400 of this embodiment of the present invention. The receiver circuit 400 is coupled to receive a very high frequency differential clock signal from a pair of clock signal lines 410, 412, and generates a single-ended output clock signal on a line 420. The lines 410, 412 may comprise one of the differential clock signal lines 172, 174 shown in FIG. 1B. The differential clock signal arrives as two signals that are 180 degrees out of phase with each other on the lines 410, 412. The receiver circuit 400 includes a first differential amplifier 430 and a second differential amplifier 432.

The first differential amplifier 430 has a non-inverting input connected to the line 410, an inverting input connected to the line 412, and amplifies the differential clock signal into a first single-ended clock signal on a line 434. The second differential amplifier 432 is connected to the lines 410, 412, in a manner opposite to the first differential amplifier 430. The second differential amplifier 432 has an inverting input connected to the line 410, a non-inverting input connected to the line 412, and amplifies the differential clock signal into a second single-ended clock signal on a line 440.

The first and second single-ended clock signals on the lines 434, 440 are 180 degrees out of phase with each other due to the opposite input connections of the differential amplifiers 430, 432. The first single-ended clock signal is inverted by an inverter 436 coupled to the line 434 and the second single-ended clock signal is buffered by a voltage follower 442 coupled to the line 440. Output signals generated by the inverter 436 and the voltage follower 442 are combined by a direct connection at the line 420 to generate the single-ended output clock signal.

In an alternate embodiment of the present invention, the inverter 436 may be coupled to the line 440 to receive the second single-ended clock signal, and the voltage follower 442 may be coupled to the line 434 to receive the first single-ended clock signal. Output signals of the inverter 436 and the voltage follower 442 may then be combined by a direct connection to generate a single-ended output clock signal.

The receiver circuit 400 shown in FIG. 4 relays a very high frequency clock signal with several significant advantages. The differential amplifiers 430, 432 reject a substantial portion of the common-mode noise in the differential clock signal, and there is minimal jitter in the single-ended output clock signal. In addition, the receiver circuit 400 does not vary substantially with respect to process differences for p-channel and n-channel transistors. Finally, the receiver circuit 400 is simple so that a change in fabrication process, for example a change to a finer process dimension, will not require a significant redesign.

Figure 5:
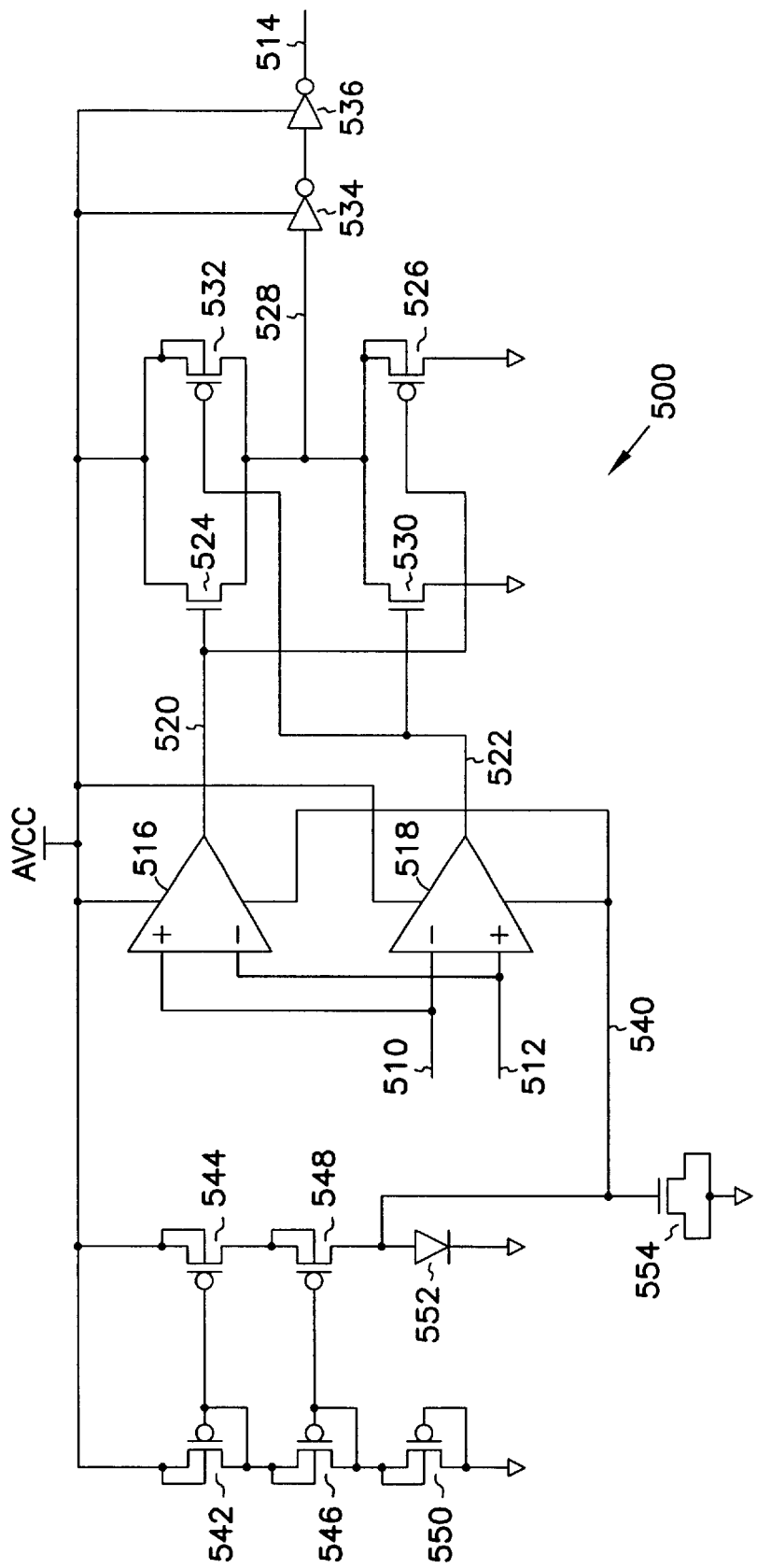
FIG. 5 is an electrical schematic diagram of a differential clock signal receiver circuit according to an embodiment of the present invention.

An electrical schematic diagram of a differential clock signal receiver circuit 500 is shown in FIG. 5 according to an embodiment of the present invention. Each of the differential clock signal receiver circuits 180, 182 ma be implemented according to the receiver circuit 500 of this embodiment of the present invention. The receiver circuit 500 is coupled to receive a very high frequency differential clock signal from a pair of clock signal lines 510, 512, and generates a single-ended output clock signal on a line 514. The lines 510, 512 may comprise one of the differential clock signal lines 172, 174 shown in FIG. 1B. The receiver circuit 500 includes a first differential amplifier 516 and a second differential amplifier 518. The first differential amplifier 516 has a non-inverting input connected to the line 510, an inverting input connected to the line 512, and amplifies the differential clock signal into a first single-ended clock signal on a line 520. The second differential amplifier 518 has an inverting input connected to the line 510, a non-inverting input connected to the line 512, and amplifies the differential clock signal into a second single-ended clock signal on a line 522.

The single-ended clock signals on the lines 520, 522 are 180 degrees out of phase with each other due to the opposite input connections of the differential amplifiers 516, 518. The first single-ended clock signal on the line 520 is connected to a gate of an n-channel transistor 524 and a gate of a p-channel transistor 526. The n-channel transistor 524 is connected between an analog supply voltage AVCC and a line 528, and the p-channel transistor 526 is connected between a ground voltage reference and the line 528. The transistors 524, 526 comprise a voltage follower such that the first single-ended clock signal on the line 520 is followed on the line 528.

The second single-ended clock signal on the line 522 is connected to a gate of an n-channel transistor 530 and a gate of a p-channel transistor 532. The n-channel transistor 530 is connected between the ground voltage reference and the line 528, and the p-channel transistor 532 is connected between the analog supply voltage AVCC and the line 528. The transistors 530, 532 comprise an inverter such that the second single-ended clock signal on the line 522 is inverted on the line 528. The inverter eliminates the phase difference between the single-ended clock signals on the lines 520, 522, and the resulting signal on the line 528 is buffered by two inverters 534, 536 to generate the single-ended output clock signal on the line 514. The differential amplifiers 516, 518 and the two inverters 534, 536 are supplied by the analog supply voltage AVCC.

A biasing circuit provides a bias voltage on a line 540 to bias the differential amplifiers 516, 518. The biasing circuit includes several transistors 542–550, a diode 552, and a capacitor 554 coupled between the analog supply voltage AVCC and the ground voltage reference.

In an alternate embodiment of the present invention the first single-ended clock signal on the line 520 is connected to the gate of the n-channel transistor 530 and the gate of the p-channel transistor 532, and the second single-ended clock signal on the line 522 is connected to the gate of the n-channel transistor 524 and the gate of the p-channel transistor 526. This connection of the transistors also results in the generation of a single-ended output clock signal on the line 514.

The parallel combination of the transistors 524, 526 that comprise the voltage follower and the transistors 530, 532 that comprise the inverter in FIG. 5 provides duty cycle correction for the single-ended output clock signal. This will be illustrated with the following example. A typical CMOS inverter includes a p-channel transistor between a voltage source and an output line and an n-channel transistor between the output line and a ground voltage reference. It often happens that the p-channel transistor is either weaker or stronger than the n-channel transistor, with the result that a duty cycle of a signal on the output line is skewed from the duty cycle of a signal input to the inverter. If a signal with a 50% duty cycle is input to the inverter and the p-channel transistor is stronger than the n-channel transistor, the inverter will generate a signal with a duty cycle greater than 50% on the output line.

The combination of the voltage follower and the inverter in the receiver circuit 500 corrects for any imbalance between p-channel and n-channel transistors because there is a p-channel transistor and an n-channel transistor on each side of the line 528, and each transistor contributes in generating the single-ended output clock signal. The rise and fall times of the single-ended output clock signal are determined by devices of both types working in tandem. Weak p-channel transistors or weak n-channel transistors affect the rise and fall times in much the same way to minimize any variation in the duty cycle of the single-ended output clock signal.

The differential amplifiers 230, 330, 332, 430, 432, 516, and 518 shown in FIGS. 2–5 are designed to have as high a bandwidth as possible for a given fabrication process. The differential amplifiers 230, 330, 332, 430, 432, 516, and 518 shown in FIGS. 2–5 are also designed to have a low gain according to the embodiments of the present invention described above.

Figure 6:
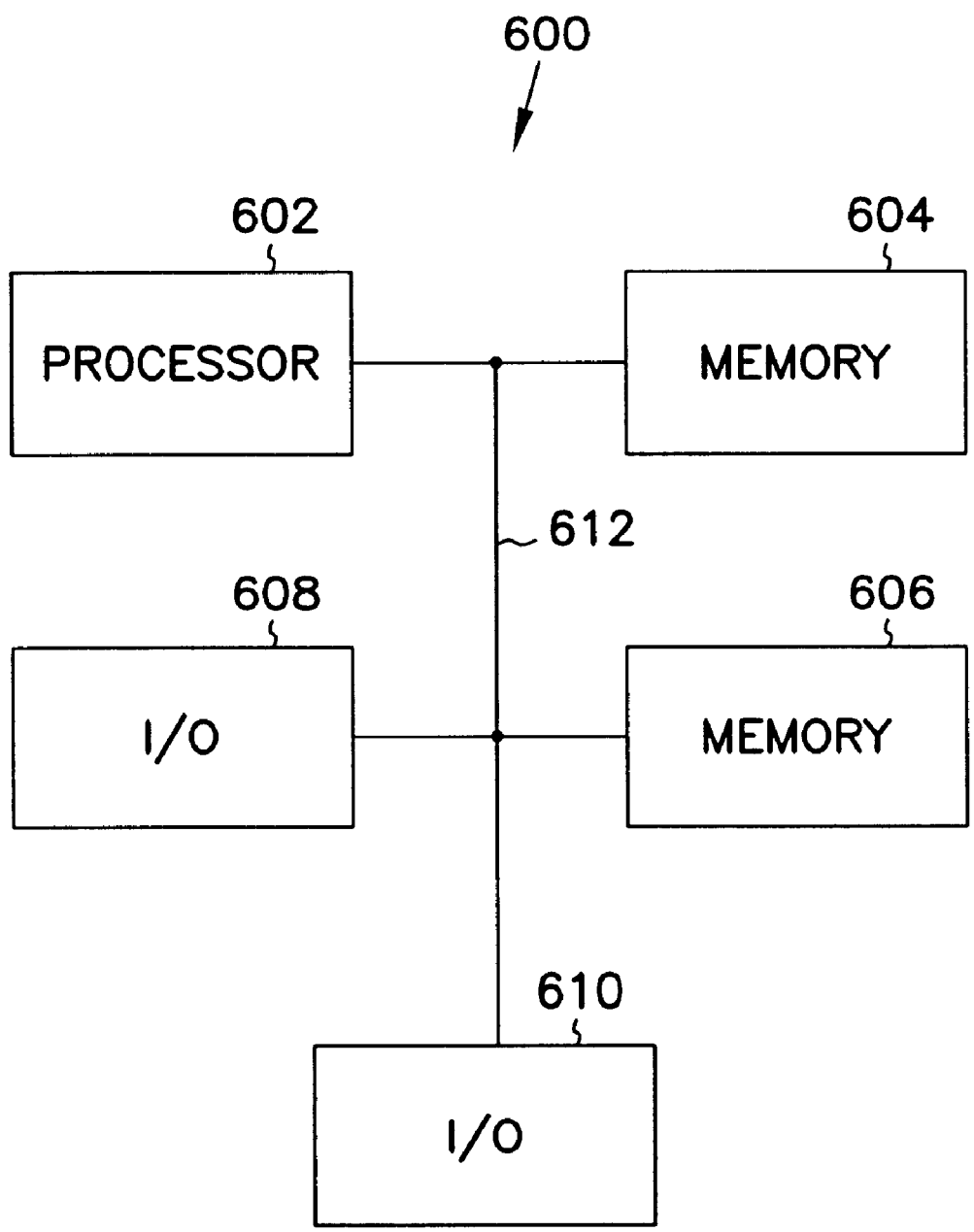
FIG. 6 is a block diagram of a computer system according to an embodiment of the present invention.

The system 100 described above with reference to FIG. 1A may take the form of a computer system such as a computer system 600 shown in a block diagram in FIG. 6 according to an embodiment of the present invention. The computer system 600 includes a processor 602, two memory devices 604, 606, and two input/output (I/O) devices 608, 610. Each of the memory devices 604, 606 is either a random-access memory (RAM), a read-only memory (ROM), a cache memory, or a storage device such as a hard disk drive, a floppy disk drive, an optical disk drive, or a tape cartridge drive. Each of the I/O devices 608, 610 is either a monitor, a pointing device such as a mouse, a keyboard, or a modem. The devices in the computer system 600 including the processor 602, the two memory devices 604, 606, and the two I/O devices 608, 610 communicate with each other through a communication link 612 connected to the devices, and one or more of the devices have a differential clock signal receiver circuit according to an embodiment of the present invention. One skilled in the art having the benefit of this description will recognize that more devices such as processors, memory circuits, and I/O devices may be connected to the communication link 612.

Those skilled in the art having the benefit of this description can appreciate that the present invention may be practiced with any variety of system. Such systems may include, for example, a video game, a hand-held calculator, a personal computer, a server, a workstation, or a multi-processor computer system, or an information appliance such as, for example, a cellular telephone or any wireless device, a pager, or a daily planner or organizer, or an information component such as, for example, a magnetic disk drive or telecommunications modem, or other appliance such as, for example, a hearing aid, washing machine or microwave oven.

Although specific embodiments have been illustrated and described herein, it will be appreciated by those skilled in the art having the benefit of this description that any equivalent arrangement may be substituted for the specific embodiments shown. The present invention is therefore limited only by the claims and equivalents thereof.

What is claimed is:

1. A semiconductor die comprising:
   a data line to receive a data signal;
   a first clock signal line and a second clock signal line to receive a differential clock signal that is synchronized with the data signal; and
   a differential amplifier coupled to the first clock signal line and the second clock signal line to amplify the differential clock signal into a single-ended output clock signal, the differential amplifier comprising:
      a first differential amplifier having a non-inverting input coupled to the first clock signal line and an inverting input coupled to the second clock signal line to amplify the differential clock signal into a single-ended clock signal;
      a second differential amplifier having an inverting input coupled to the first clock signal line and a non-inverting input coupled to the second clock signal line to amplify the differential clock signal into a single-ended clock signal;
      an inverter having an input coupled to one of the first differential amplifier or the second differential amplifier to receive one of the single-ended clock signals, and an output to generate an inverted single-ended clock signal; and
      a voltage follower having an input coupled to one of the first differential amplifier or the second differential amplifier to receive one of the single-ended clock signals that is not received by the inverter and to generate an intermediate single-ended clock signal, the voltage follower having an output connected to the output of the inverter to combine the inverted single-ended clock signal with the intermediate single-ended clock signal to generate the single-ended output clock signal.

2. A semiconductor die comprising:
   a data line to receive a data signal;
   a first clock signal line and a second clock signal line to receive a differential clock signal that is synchronized with the data signal;
   a first differential amplifier coupled to the first clock signal line and the second clock signal line to amplify the differential clock signal into a first single-ended clock signal;
   a second differential amplifier coupled to the first clock signal line and the second clock signal line to amplify the differential clock signal into a second single-ended clock signal;
   an inverter having an input coupled to the first differential amplifier to receive the first single-ended clock signal and to invert the first single-ended clock signal at an output; and
   a voltage follower having an input coupled to the second differential amplifier to receive the second single-ended clock signal and an output connected to the output of the inverter to generate a single-ended output clock signal.

3. The semiconductor die of claim 2 wherein:
   the first differential amplifier further comprises a non-inverting input coupled to the first clock signal line and an inverting input coupled to the second clock signal line;

the second differential amplifier further comprises an inverting input coupled to the first clock signal line and a non-inverting input coupled to the second clock signal line;

the inverter comprises:
  a p-channel transistor coupled between a voltage supply and an output line and having a control terminal coupled to the first differential amplifier to receive the first single-ended clock signal; and
  an n-channel transistor coupled between the output line and a voltage reference and having a control terminal coupled to the first differential amplifier to receive the first single-ended clock signal; and the voltage follower comprises:
  an n-channel transistor coupled between the voltage supply and the output line and having a control terminal coupled to the second differential amplifier to receive the second single-ended clock signal; and
  a p-channel transistor coupled between the output line and the voltage reference and having a control terminal coupled to the second differential amplifier to receive the second single-ended clock signal.

4. The semiconductor die of claim 3, further comprising:
a buffer circuit coupled to the output line to buffer the single-ended output clock signal; and
a biasing circuit to bias the first differential amplifier and the second differential amplifier.

5. A system comprising:
a first circuit;
a second circuit;
a communication link coupled between the first circuit and the second circuit, the communication link comprising:
  a data bus coupled to receive a plurality of data signals from the second circuit; and
  a first clock signal line and a second clock signal line coupled to receive a differential clock signal from the second circuit that is synchronized with the data signals;
a receiver circuit in the first circuit comprising:
  a first differential amplifier coupled to the first clock signal line and the second clock signal line to amplify the differential clock signal into a first single-ended clock signal;
  a second differential amplifier coupled to the first clock signal line and the second clock signal line to amplify the differential clock signal into a second single-ended clock signal;
  an inverter having an input coupled to the first differential amplifier to receive the first single-ended clock signal and to invert the first single-ended clock signal at an output; and
  a voltage follower having an input coupled to the second differential amplifier to receive the second single-ended clock signal and an output connected to the output of the inverter to generate a single-ended output clock signal.

6. The system of claim 5 wherein:
the first differential amplifier further comprises a non-inverting input coupled to the first clock signal line and an inverting input coupled to the second clock signal line;
the second differential amplifier further comprises an inverting input coupled to the first clock signal line and a non-inverting input coupled to the second clock signal line;

the inverter comprises:
  a p-channel transistor coupled between a voltage supply and an output line and having a control terminal coupled to the first differential amplifier to receive the first single-ended clock signal; and
  an n-channel transistor coupled between the output line and a voltage reference and having a control terminal coupled to the first differential amplifier to receive the first single-ended clock signal; and the voltage follower comprises:
  an n-channel transistor coupled between the voltage supply and the output line and having a control terminal coupled to the second differential amplifier to receive the second single-ended clock signal; and
  a p-channel transistor coupled between the output line and the voltage reference and having a control terminal coupled to the second differential amplifier to receive the second single-ended clock signal.

7. The system of claim 6, further comprising:
a buffer circuit coupled to the output line to buffer the single-ended output clock signal; and
a biasing circuit to bias the first differential amplifier and the second differential amplifier.

8. The system of claim 5 wherein the first circuit and the second circuit are located in a single semiconductor die.

9. The system of claim 5 wherein:
the first circuit is located in a first semiconductor die; and
the second circuit is located in a second semiconductor die.

10. The system of claim 5, further comprising:
a plurality of circuits;
a very high frequency common clock generator coupled to each of the circuits to generate a very high frequency clock signal;
a plurality of communication links, each circuit being coupled to one or more neighboring circuits by one of the communication links, each communication link comprising:
  a data bus;
  a first differential clock signal line coupled to carry a very high frequency differential clock signal in a first direction; and
  a second differential clock signal line coupled to carry a very high frequency differential clock signal in a second direction;
a differential clock signal generating circuit in each circuit coupled to one or more of the differential clock signal lines in one or more of the communication links to generate a very high frequency differential clock signal; and
a receiver circuit in each circuit to receive one of the very high frequency differential clock signals.

11. The system of claim 10 wherein each differential clock signal line comprises a first clock signal line and a second clock signal line to carry one of the very high frequency differential clock signals.

12. The system of claim 10 wherein each receiver circuit comprises:
a first differential amplifier coupled to one of the differential clock signal lines to amplify one of the very high frequency differential clock signals into a first single-ended clock signal;
a second differential amplifier coupled to the differential clock signal line to amplify the very high frequency differential clock signal into a second single-ended clock signal;

an inverter having an input coupled to the first differential amplifier to receive the first single-ended clock signal and to invert the first single-ended clock signal at an output; and a voltage follower having an input coupled to the second differential amplifier to receive the second single-ended clock signal and an output connected to the output of the inverter to generate a single-ended output clock signal.

13. The system of claim 10 wherein the circuits are located in a single semiconductor die.

14. The system of claim 10 wherein the circuits are located in two or more separate semiconductor dies.

15. A method comprising:

receiving a data signal on a data line;

receiving a differential clock signal on a first clock signal line and a second clock signal line that is synchronized with the data signal;

amplifying the differential clock signal into a single-ended clock signal in a first differential amplifier having a non-inverting input coupled to the first clock signal line and an inverting input coupled to the second clock signal line;

amplifying the differential clock signal into a single-ended clock signal in a second differential amplifier having an inverting input coupled to the first clock signal line and a non-inverting input coupled to the second clock signal line;

inverting one of the single-ended clock signals to generate an inverted single-ended clock signal; and combining the inverted single-ended clock signal with the single-ended clock signal that is not inverted to generate a single-ended output clock signal.

16. A method comprising:

receiving a data signal on a data line;

receiving a differential clock signal on a first clock signal line and a second clock signal line that is synchronized with the data signal;

amplifying the differential clock signal into a first single-ended clock signal in a first differential amplifier coupled to the first clock signal line and the second clock signal line;

amplifying the differential clock signal into a second single-ended clock signal in a second differential amplifier coupled to the first clock signal line and the second clock signal line;

inverting the first single-ended clock signal in an inverter to generate an inverted single-ended clock signal; and combining the inverted single-ended clock signal with the second single-ended clock signal buffered by a voltage follower to generate a single-ended output clock signal.

17. The method of claim 16 wherein amplifying the differential clock signal into a second single-ended clock signal further comprises amplifying the differential clock signal into a second single-ended clock signal that is 180 degrees out of phase with the first single-ended clock signal.

18. The method of claim 16 wherein:

inverting the first single-ended clock signal in an inverter further comprises:

coupling the first single-ended clock signal to a gate of a p-channel transistor coupled between a voltage source and an output line; and coupling the first single-ended clock signal to a gate of an n-channel transistor coupled between the output line and a voltage reference to generate the inverted single-ended clock signal on the output line; and combining the inverted single-ended clock signal further comprises:

coupling the second single-ended clock signal to a gate of an n-channel transistor coupled between the voltage source and the output line; and coupling the second single-ended clock signal to a gate of a p-channel transistor coupled between the output line and the voltage reference to generate the single-ended output clock signal on the output line.

19. The method of claim 16, further comprising:

buffering the single-ended output clock signal; and biasing the first differential amplifier and the second differential amplifier.

20. A method comprising:

transmitting data signals from a first circuit to a second circuit over a data bus;

generating a differential clock signal in the first circuit that is synchronized with the data signals;

transmitting the differential clock signal over a first clock signal line and a second clock signal line to the second circuit; and amplifying the differential clock signal in a differential clock signal receiver circuit in the second circuit comprising:

amplifying the differential clock signal into a first single-ended clock signal in a first differential amplifier coupled to the first clock signal line and the second clock signal line;

amplifying the differential clock signal into a second single-ended clock signal in a second differential amplifier coupled to the first clock signal line and the second clock signal line;

inverting the first single-ended clock signal in an inverter to generate an inverted single-ended clock signal; and combining the inverted single-ended clock signal with the second single-ended clock signal buffered by a voltage follower to generate a single-ended output clock signal.

21. The method of claim 20 wherein amplifying the differential clock signal into a second single-ended clock signal further comprises amplifying the differential clock signal into a second single-ended clock signal that is 180 degrees out of phase with the first single-ended clock signal.

22. The method of claim 20 wherein:

inverting the first single-ended clock signal in an inverter further comprises:

coupling the first single-ended clock signal to a gate of a p-channel transistor coupled between a voltage source and an output line; and coupling the first single-ended clock signal to a gate of an n-channel transistor coupled between the output line and a voltage reference to generate the inverted single-ended clock signal on the output line; and combining the inverted single-ended clock signal further comprises:

coupling the second single-ended clock signal to a gate of an n-channel transistor coupled between the voltage source and the output line; and coupling the second single-ended clock signal to a gate of a p-channel transistor coupled between the output line and the voltage reference to generate the single-ended output clock signal on the output line.

23. The method of claim 20, further comprising:

buffering the single-ended output clock signal; and biasing the first differential amplifier and the second differential amplifier.

24. The method of claim 20, further comprising:

exchanging data signals and very high frequency differential clock signals between a plurality of circuits over a plurality of communication links, each circuit being coupled to one or more neighboring circuits by one of the communication links;

generating a very high frequency clock signal in a very high frequency common clock signal generator;

coupling the very high frequency clock signal to each of the circuits;

generating a very high frequency differential clock signal in a differential clock signal generating circuit in one or more of the circuits; and amplifying a very high frequency differential clock signal in a differential clock signal receiver circuit in one or more of the circuits.

25. The semiconductor die of claim 1 wherein:

the data line comprises a data bus to receive a plurality of data signals; and the differential clock signal is synchronized with the data signals.

26. The semiconductor die of claim 2 wherein:

the data line comprises a data bus to receive a plurality of data signals; and the differential clock signal is synchronized with the data signals.

27. The method of claim 15 wherein:

receiving a data signal further comprises receiving a plurality of data signals on a data bus; and receiving a differential clock signal further comprises receiving the differential clock signal that is synchronized with the data signals.

28. The method of claim 16 wherein:

receiving a data signal further comprises receiving a plurality of data signals on a data bus; and receiving a differential clock signal further comprises receiving the differential clock signal that is synchronized with the data signals.

29. The system of claim 10 wherein each circuit comprises a processor.

30. A system comprising:

a plurality of circuits;

a very high frequency common clock generator coupled to each of the circuits to generate a very high frequency clock signal;

a plurality of communication links, each circuit being coupled to one or more neighboring circuits by one of the communication links, each communication link comprising:

a data bus;

a first differential clock signal line comprising two lines and coupled to carry a very high frequency differential clock signal in a first direction; and a second differential clock signal line comprising two lines and coupled to carry a very high frequency differential clock signal in a second direction;

a differential clock signal generating circuit in each circuit coupled to one or more of the differential clock signal lines in one or more of the communication links to generate a very high frequency differential clock signal; and a receiver circuit in each circuit to receive one of the very high frequency differential clock signals, the receiver circuit comprising:

a first differential amplifier coupled to one of the differential clock signal lines to amplify one of the very high frequency differential clock signals into a first single-ended clock signal;

a second differential amplifier coupled to the differential clock signal line to amplify the very high frequency differential clock signal into a second single-ended clock signal;

an inverter having an input coupled to the first differential amplifier to receive the first single-ended clock signal and to invert the first single-ended clock signal at an output; and a voltage follower having an input coupled to the second differential amplifier to receive the second single-ended clock signal and an output connected to the output of the inverter to generate a single-ended output clock signal.

31. The system of claim 30 wherein each differential clock signal line comprises a first clock signal line and a second clock signal line to carry one of the very high frequency differential clock signals.

32. The system of claim 30 wherein the circuits are located in a single semiconductor die.

33. The system of claim 30 wherein the circuits are located in two or more separate semiconductor dies.

34. The system of claim 30 wherein each circuit comprises a processor.

* * * * *

UNITED STATES PATENT AND TRADEMARK OFFICE
CERTIFICATE OF CORRECTION

| | | |
|---|---|---|
| PATENT NO. | : 6,411,151 B1 | Page 1 of 1 |
| DATED | : June 25, 2002 | |
| INVENTOR(S) | : Rajendran Nair, Gregory E. Dermer, Stephen R. Mooney and Nitin Y. Borkar | |

It is certified that error appears in the above-identified patent and that said Letters Patent is hereby corrected as shown below:

<u>Title page,</u>
Item [73], Assignee, delete "Inter" and insert -- Intel --, therefor.

<u>Column 6,</u>
Line 4, delete "ma" and insert -- may --, therefor.

Signed and Sealed this

Third Day of September, 2002

*Attest:*

*Attesting Officer*

JAMES E. ROGAN
*Director of the United States Patent and Trademark Office*